United States Patent
Sandow et al.

(10) Patent No.: US 10,748,995 B2
(45) Date of Patent: *Aug. 18, 2020

(54) INSULATED GATE BIPOLAR TRANSISTOR DEVICE HAVING A FIN STRUCTURE

(71) Applicant: Infineon Technologies AG, Neubiberg (DE)

(72) Inventors: Christian Philipp Sandow, Haar (DE); Franz Josef Niedernostheide, Hagen am Teutoburger Wald (DE); Vera van Treek, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/506,429

(22) Filed: Jul. 9, 2019

(65) Prior Publication Data
US 2019/0333991 A1 Oct. 31, 2019

Related U.S. Application Data

(63) Continuation of application No. 15/979,333, filed on May 14, 2018, now Pat. No. 10,388,734, which is a (Continued)

(30) Foreign Application Priority Data

Jun. 25, 2014 (DE) .................. 10 2014 108 913

(51) Int. Cl.
*H01L 29/06* (2006.01)
*H01L 29/10* (2006.01)
(Continued)

(52) U.S. Cl.
CPC .......... *H01L 29/0676* (2013.01); *B82Y 10/00* (2013.01); *H01L 29/0673* (2013.01);
(Continued)

(58) Field of Classification Search
None
See application file for complete search history.

(56) References Cited

U.S. PATENT DOCUMENTS

| 6,118,149 A | 9/2000 | Nakagawa et al. |
| 8,114,774 B2 | 2/2012 | Hurkx et al. |
| (Continued) | | |

FOREIGN PATENT DOCUMENTS

| CN | 101399207 A | 4/2009 |
| CN | 101473421 A | 7/2009 |
| (Continued) | | |

OTHER PUBLICATIONS

Nakagawa, Akio, "Theoretical Investigation of Silicon Limit Characteristics of IGBT", Proceedings of the 18th International Symposium on Power Semiconductor Devices & IC's, Jun. 4-8, 2006, 1-4.

*Primary Examiner* — Whitney Moore
(74) *Attorney, Agent, or Firm* — Murphy, Bilak & Homiller, PLLC

(57) ABSTRACT

A transistor device includes a first silicon nanowire array-MOSFET and a second silicon nanowire array-MOSFET integrated with a bulk drift region. The first silicon nanowire array-MOSFET is configured as an n-MOSFET by substantially only accommodating an electron current, and the second silicon nanowire array-MOSFET is configured as a p-MOSFET by substantially only accommodating a hole electron current. A current strength of a current through the first silicon nanowire array-MOSFET caused by electrons is at least 10 times larger than a current through the first silicon nanowire array-MOSFET caused by holes in an on-state of the transistor device. Further embodiments of transistor devices are described.

13 Claims, 8 Drawing Sheets

Related U.S. Application Data continuation of application No. 15/370,989, filed on Dec. 6, 2016, now Pat. No. 9,978,837, which is a continuation of application No. 14/737,984, filed on Jun. 12, 2015, now Pat. No. 9,525,029.

(51) Int. Cl.
  *B82Y 10/00* (2011.01)
  *H01L 29/423* (2006.01)
  *H01L 29/739* (2006.01)

(52) U.S. Cl.
  CPC .... *H01L 29/1095* (2013.01); *H01L 29/42356* (2013.01); *H01L 29/7396* (2013.01)

(56) References Cited

U.S. PATENT DOCUMENTS

| | | |
|---|---|---|
| 2004/0129983 A1 | 7/2004 | Mallikarjunaswamy |
| 2004/0137690 A1 | 7/2004 | Mallikarjunaswamy et al. |
| 2006/0273389 A1 | 12/2006 | Cohen et al. |
| 2007/0001263 A1 | 1/2007 | Nakagawa |
| 2007/0052012 A1 | 3/2007 | Forbes |
| 2008/0029909 A1 | 2/2008 | Hijzen et al. |
| 2011/0303972 A1 | 12/2011 | Saitoh et al. |
| 2016/0049391 A1 | 2/2016 | Colinge et al. |

FOREIGN PATENT DOCUMENTS

| | | |
|---|---|---|
| JP | H111103057 A | 4/1999 |
| JP | 2006332662 A | 12/2006 |
| JP | 2008503081 A | 1/2008 |
| JP | 2008507838 A | 3/2008 |
| JP | 2008205168 A | 9/2008 |
| JP | 2011238726 A | 11/2011 |
| JP | 2011258898 A | 12/2011 |
| JP | 2013062461 A | 4/2013 |
| WO | 2005064664 A1 | 7/2005 |

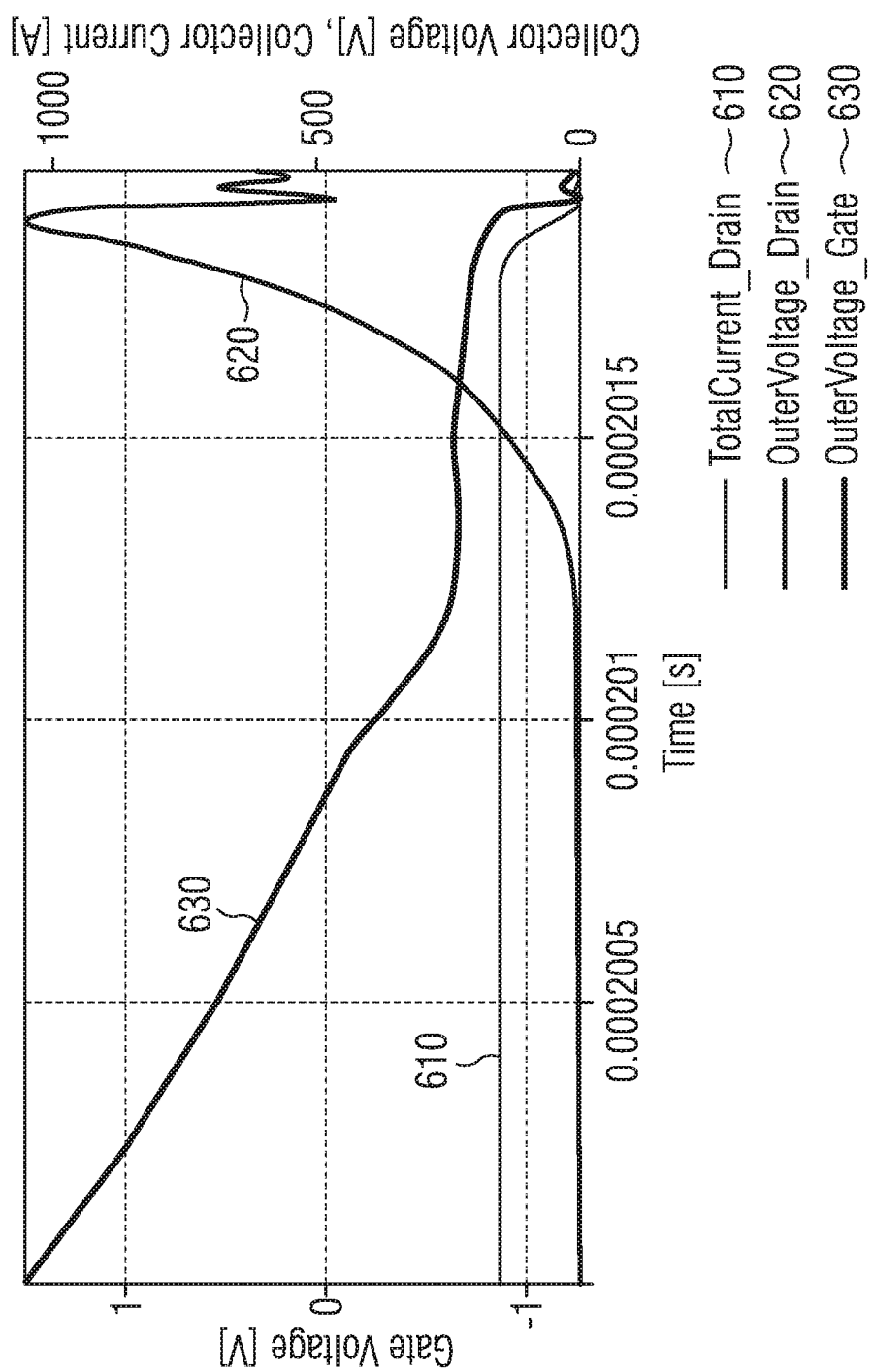

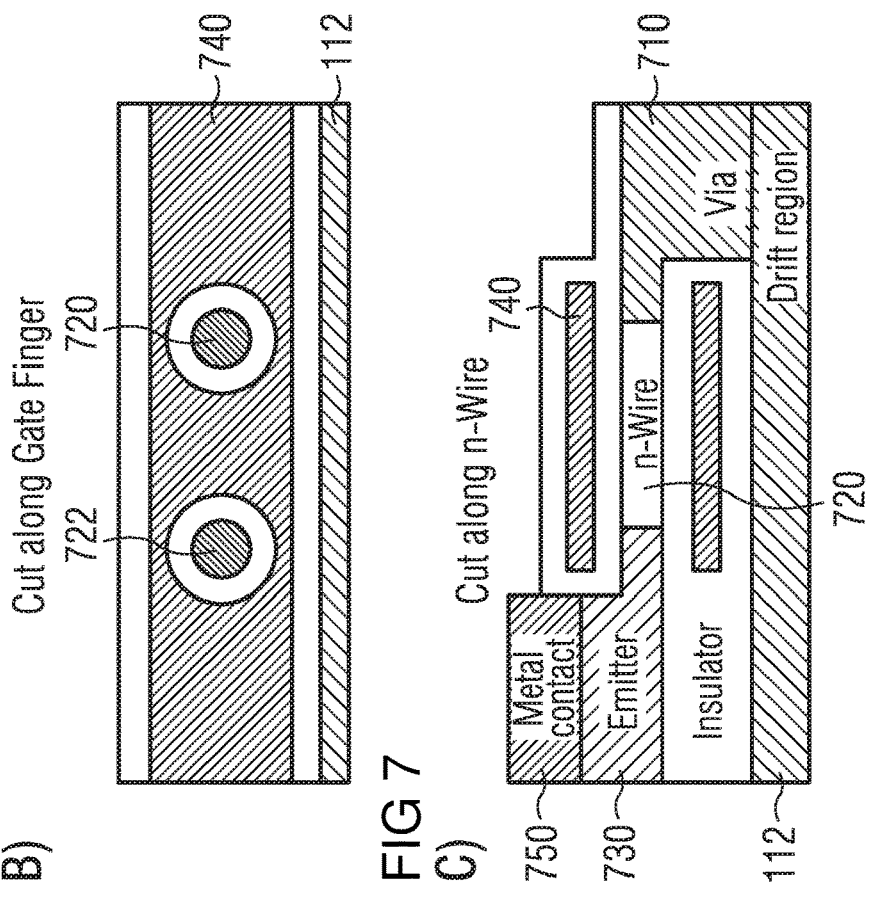
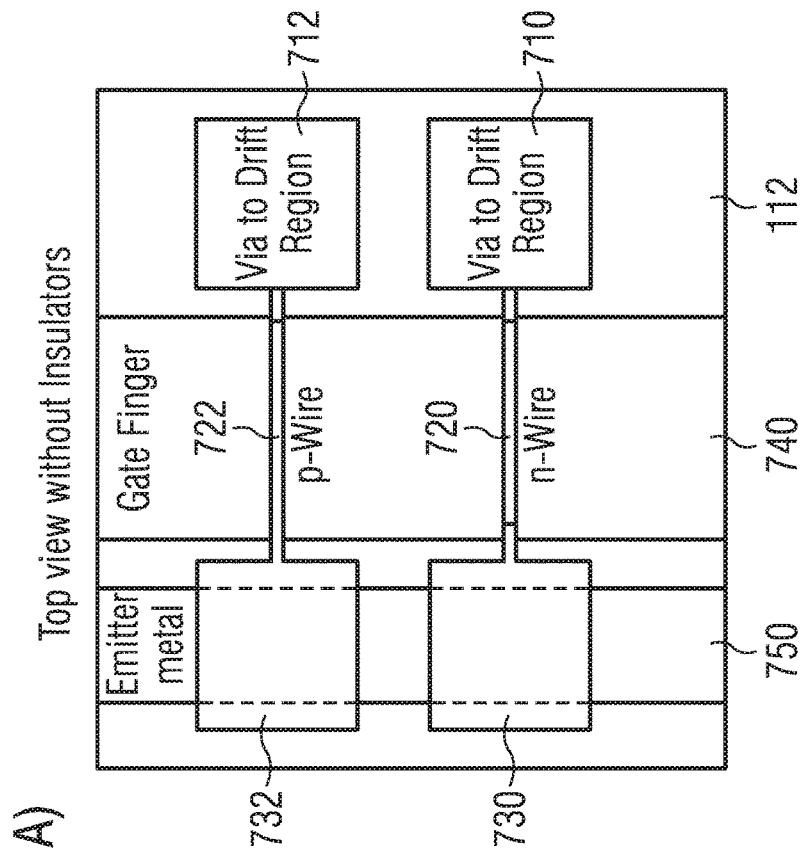

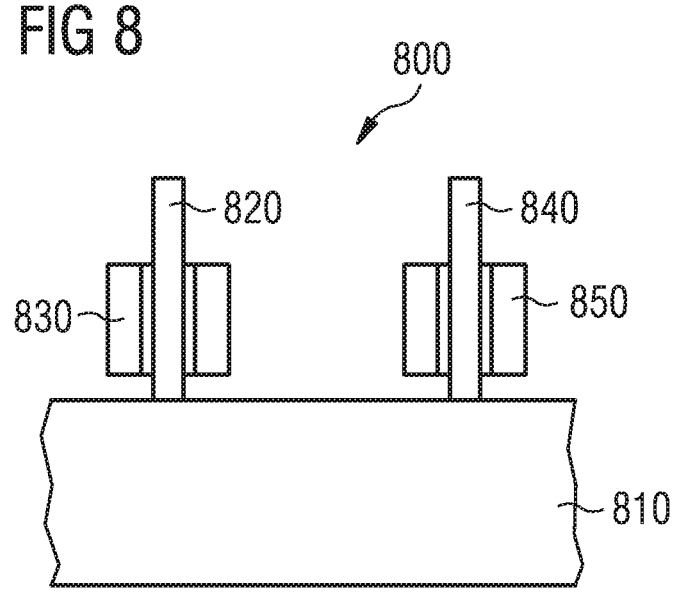
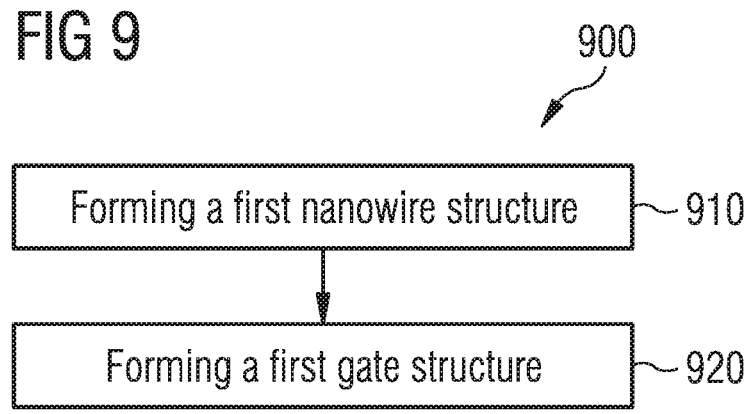

INSULATED GATE BIPOLAR TRANSISTOR DEVICE HAVING A FIN STRUCTURE

RELATED APPLICATIONS

This Application is a continuation of and claims priority to U.S. application Ser. No. 15/979,333 filed 14 May 2018, which in turn is a continuation of and claims priority to U.S. application Ser. No. 15/370,989 filed 6 Dec. 2016 patented as U.S. Pat. No. 9,978,837 on 22 May 2018, which in turn is a continuation of and claims priority to U.S. application Ser. No. 14/737,984 filed 12 Jun. 2015 patented as U.S. Pat. No. 9,525,029 on 20 Dec. 2016. The content of each of the aforementioned applications is incorporated by reference herein in its entirety.

TECHNICAL FIELD

Embodiments relate to measures for decreasing the on-state resistance of semiconductor devices and in particular to an insulated gate bipolar transistor device, a semiconductor device and a method for forming an insulated gate bipolar transistor device or semiconductor device.

BACKGROUND

The power loss within power semiconductor devices is mainly caused by the on-state resistance of the semiconductor device. For example, a small reduction of the on-state resistance or voltage drop between collector and emitter of an insulated gate bipolar transistor may significantly reduce the power loss of the device. A reduction of the power loss may reduce the heating of the device and may increase the durability or life cycle of the semiconductor device. Further, the risk of destruction due to latch-up may be reduced. It is desired to provide semiconductor devices with increased durability or life cycle and/or decreased power loss, for example.

SUMMARY

It is a demand to provide a semiconductor device with increased durability or life cycle and/or decreased power loss.

Such a demand may be satisfied by the embodiments described herein.

Some embodiments relate to an insulated gate bipolar transistor device comprising a semiconductor substrate, a first nanowire structure and a first gate structure. The semiconductor substrate comprises a drift region of an insulated gate bipolar transistor structure and the first nanowire structure of the insulated gate bipolar transistor structure is connected to the drift region. Further, the first gate structure of the insulated gate bipolar transistor structure extends along at least a part of the first nanowire structure.

Some embodiments relate to the semiconductor device comprising a semiconductor substrate, a first nanowire structure, a first gate structure, a second nanowire structure and a second gate structure of a field-effect structure. The first nanowire structure of the field-effect structure is connected to the semiconductor substrate and the first gate structure of the field-effect structure extends along at least a part of the first nanowire structure. Further, the second nanowire structure of the field-effect structure is connected to the semiconductor substrate and the second gate structure of the field-effect structure extends along at least a part of the second nanowire structure. At least a part of the semiconductor substrate connected to the first nanowire structure comprises a first conductivity type and at least a part of the first wire structure comprises the first conductivity type. Further, at least a part of the semiconductor substrate connected to the second nanowire structure comprises the first conductivity type and at least a part of the second nanowire structure comprises a second conductivity type.

Further embodiments relate to a method for forming an insulated gate bipolar transistor device. The method comprises forming a first nanowire structure of an insulated gate bipolar transistor structure connected to a drift region of a semiconductor substrate and forming a first gate structure of the insulated gate bipolar transistor structure surrounding at least a part of the first nanowire structure.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which

FIG. 6 shows a diagram indicating the gate voltage, the collector voltage and the collector current over time during switch-off of an insulated gate bipolar transistor device;

FIG. 7a shows a schematic top view of an insulated gate bipolar transistor device with horizontal nanowire structures;

FIG. 7b shows a schematic cross section of a cut along the gate finger of the device shown in FIG. 7a;

FIG. 7c shows a schematic cross section along the n-wire of the device shown in FIG. 7a;

FIG. 8 shows a schematic cross section of a semiconductor device; and

FIG. 9 shows a flow chart of a method for forming an insulated gate bipolar transistor device.

DETAILED DESCRIPTION

Various example embodiments will now be described more detailed with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
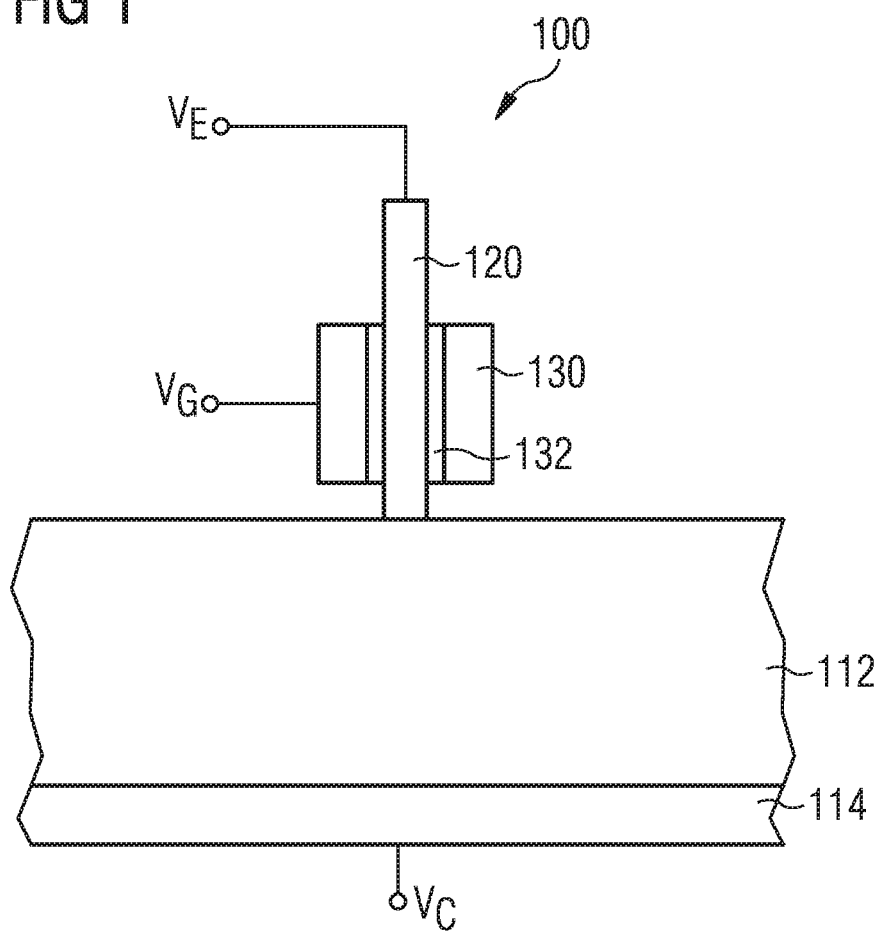
FIG. 1 shows a schematic cross section of an insulated gate bipolar transistor device.

FIG. 1 shows a schematic cross section of an insulated gate bipolar transistor device 100 or a part of an insulated gate bipolar transistor device according to an embodiment. The insulated gate bipolar transistor device 100 comprises a semiconductor substrate comprising a drift region 112 of an insulated gate bipolar transistor structure. Further, the insulated gate bipolar transistor device 100 comprises a (first) nanowire structure 120 and a (first) gate structure 130. The (first) nanowire structure 120 of the insulated gate bipolar transistor structure is connected to the drift region 112. Further, the (first) gate structure 130 of the insulated gate bipolar transistor structure extends along at least a part of the (first) nanowire structure 120.

Due to the implementation of a nanowire structure with the corresponding gate structure, the insulated gate bipolar transistor structure can be controlled by the gate structure controlling a substantially unipolar current through the nanowire. For example, for an n-channel insulated gate bipolar transistor structure substantially only electrons are able to pass the nanowire structure in an on-state of the insulated gate bipolar transistor structure. Due to the substantially unipolar current flow through the nanowire structure, the on-state resistance of the insulated gate bipolar transistor structure may be significantly reduced. Further, the occurrence of an undesired latch-up may be significantly reduced. In this way the power loss may be reduced and/or the durability or life cycle of the insulated gate bipolar transistor device may be increased.

The drift region 112 of the insulated gate bipolar transistor structure is part of the insulated gate bipolar transistor structure separating an emitter part and a collector part of the insulated gate bipolar transistor structure. For example, the emitter part of the insulated gate bipolar transistor structure may be implemented by the first nanowire structure 120 and the first gate structure 130. Further, the semiconductor substrate may comprise a collector region 114 (e.g. located at the backside of the semiconductor substrate) comprising a conductivity type (e.g. n or p) different from a conductivity type of the drift region 112 (e.g. p or n).

For example, the drift region 112 may be a region of the semiconductor substrate located at the front side of the semiconductor substrate (e.g. comprising an n-doping for an n-channel IGBT) and the collector region may be implemented by a layer located at the back side of the semiconductor substrate (e.g. comprising a p-doping for an n-channel IGBT).

A main surface or front side surface of the semiconductor substrate may be a semiconductor surface of the semiconductor substrate towards metal layers, insulation layers and/or passivation layers on top of the semiconductor surface. In comparison to a basically vertical edge (e.g. resulting from separating the semiconductor substrate from others) of the semiconductor substrate, the main surface of the semiconductor substrate may be a basically horizontal surface extending laterally. The main surface of the semiconductor substrate may be a basically even plane (e.g. neglecting unevenness of the semiconductor structure due to the manufacturing process or trenches). In other words, the main surface of the semiconductor substrate may be the interface between the semiconductor material and an insulation layer, metal layer or passivation layer on top of the semiconductor substrate.

Optionally, a field-stop region may be arranged between the drift region 112 and the collector region 114. The field-stop region may comprise a higher doping concentration (e.g. n+) than the drift region 112 (e.g. n−).

The first nanowire structure 120 may be a semiconductor structure comprising at least in one direction a dimension below 1 µm. The first nanowire structure 120 may extend from the drift region 112 of the semiconductor substrate to a metal contact or metal layer (e.g. emitter metal structure) of the insulated gate bipolar transistor structure. In other words, the first nanowire structure may extend from a main surface of the semiconductor substrate vertically towards a metal layer or a metal contact. A current (e.g. emitter current) may flow from the metal contact to the drift region 112 or vice versa in an on-state of the insulated gate bipolar transistor structure, for example. The first nanowire structure 120 may comprise a substantially circular shaped, triangular shaped, square shaped or rectangular shaped cross section (e.g. cross section orthogonal to a current flow direction through the nanowire structure). Also a fin-type nanowire structure may be possible, if the first nanowire structure 120 may comprise a substantially rectangular cross section with a significantly larger (e.g. more than 10 times larger, more than 50 times larger or more than 100 times larger) extension in one direction than in another orthogonal direction (e.g. which may be the direction below 1 µm).

For example, the first nanowire structure 120 may comprise a smallest dimension (e.g. diameter of substantially circular shaped structure or the smaller dimension of a rectangular shaped structure) within the region of the first gate structure 130 (e.g. a part of the nanowire structure, the gate structure extends along) of less than 200 nm (or less than 100 nm, less than 50 nm or less than 20 nm, for example, 15 nm, 30 nm, 20 nm or 10 nm). Further, the first nanowire structure 120 may comprise a length (e.g. in parallel to the current flow direction through the nanowire structure) within the region of the first gate structure 130 (e.g. part of the nanowire structure, the gate structure extends along) between 30 nm and 50 µm (or between 30 nm and 5 um or between 50 nm and 1 µm or between 100 nm and 500 nm, for example, 15 nm, 100 nm, 200 nm, 500 nm or 1 μm). The first nanowire structure 120 may be formed by an epitaxial growth in a bottom-up approach (e.g. vapor liquid solid technique) or by lithography and etching, for example.

The first nanowire structure 120 may start directly from the drift region 112 of the semiconductor substrate (e.g. for vertical nanowire structures extending orthogonal to a main surface of the semiconductor substrate) or may be electrically connected to the drift region 112 (e.g. for a horizontal nanowire structure as shown in FIG. 7a through c).

The insulated gate bipolar transistor structure may be a structure providing the functionality of an insulated gate bipolar transistor. The insulated gate bipolar transistor structure may share a backside collector region 114 and/or a drift region 112 with other insulated gate bipolar transistor structures, for example. Further, the insulated gate bipolar transistor structure may comprise one or more first nanowire structures with corresponding first gate structures. For example, the insulated gate bipolar transistor structure may comprise a structure for discharging holes from the drift zone during turn off of the insulated gate bipolar transistor structure.

The insulated gate bipolar transistor device 100 may be implemented by any semiconductor processing technology capable of forming the mentioned structures, for example. In other words, the semiconductor substrate of the insulated gate bipolar transistor device 100 may be a silicon-based semiconductor substrate, a silicon carbide-based semiconductor substrate, a gallium arsenide-based semiconductor substrate or a gallium nitride-based semiconductor substrate, for example. The semiconductor substrate may be an SOI (silicon on insulator) substrate, an SON (silicon on nothing) substrate or may be implemented by an epitaxial layer, for example.

Figure 4:
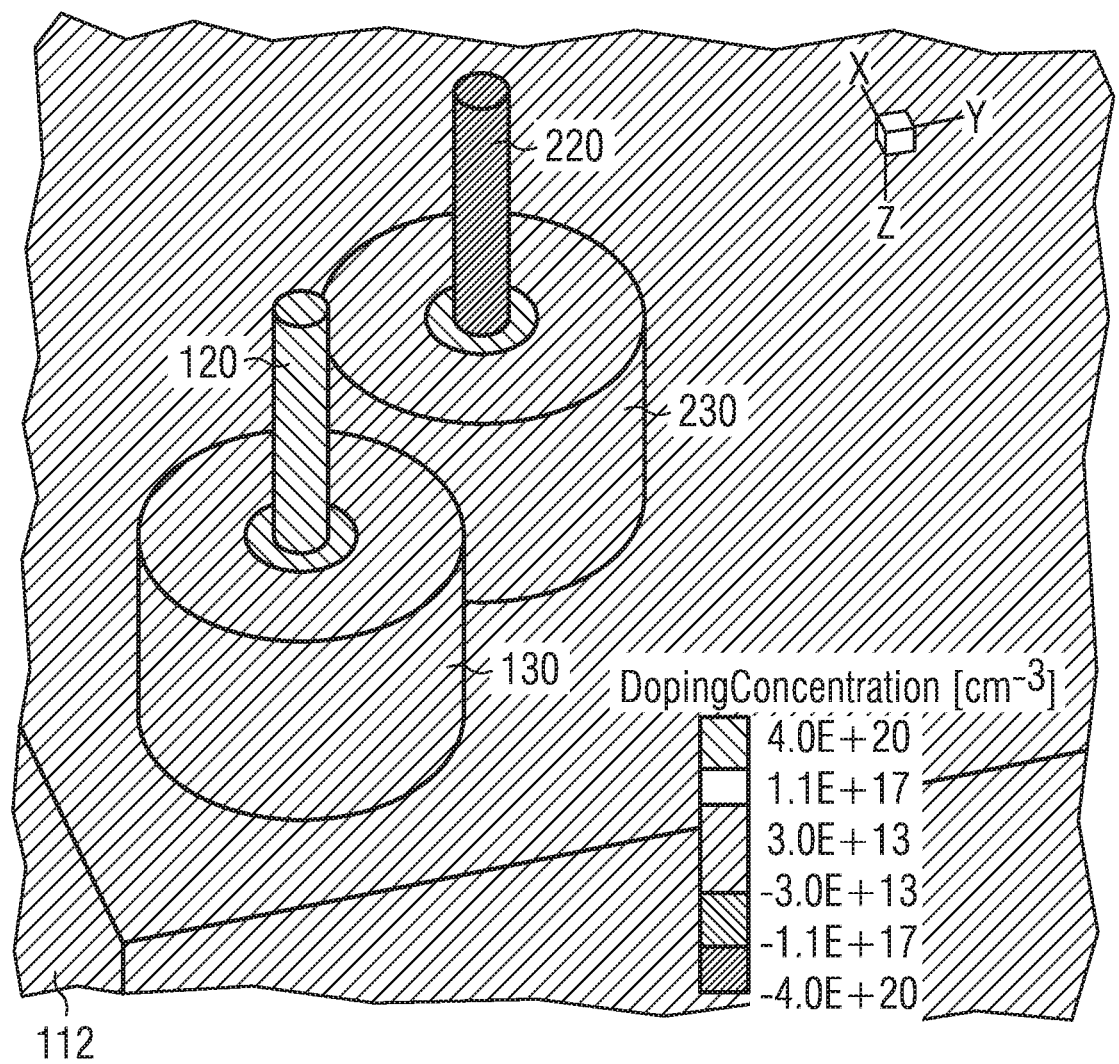
FIG. 4 shows a schematic three-dimensional illustration of two nanowire structures surrounded by two gate structures.

The first gate structure 130 (e.g. polysilicon or metal) may be electrically insulated from the first nanowire structure 120 by a gate insulation layer 132. The first gate structure 130 extends along at least a part of the first nanowire structure 120. A voltage $V_G$ applied to the first gate structure 130 influences a conduction channel within the nanowire structure 120 so that a field-effect structure is formed. The first gate structure 130 may extend along the first nanowire structure 120 only at one side, at two sides (e.g. opposite sides of a fin-type nanowire structure) or may (completely) surround a part of the first nanowire structure 120 (e.g. as shown in FIG. 4).

Due to the small dimension in at least one direction of the first nanowire structure 120, a voltage applied to the first gate structure 130 may have a large influence to charge carriers within in the nanowire structure. In this way, also a substantially complete volume inversion may be achievable by forming a small nanowire structure and/or a gate insulation with small effective electrical thickness and/or by applying corresponding voltages to the first gate structure 130, for example.

For example, the gate insulation layer 132 may comprise an effective electrical thickness (e.g. thickness of a silicon oxide layer or a high-k dielectric with larger thickness, but same influence as with a silicon dioxide layer with corresponding thickness) between 0.5 nm and 100 nm (or 20 nm), for example.

The first nanowire structure 120 is connected (e.g. directly or electrically connected through an electrically conductive material) to the drift region 112 and may be connected or connectable to an emitter voltage $V_E$ (e.g. through a pad connectable to an external voltage source). Similarly, the collector region 114 may be connected or connectable to a collector voltage $V_C$ (e.g. through a pad or a backside electrode to an external voltage source or ground). Further, the first gate structure 130 is connected or connectable to a gate voltage source $V_G$ (e.g. an internal voltage source through internal wiring or to an external voltage source through a pad of the device) configured to provide a gate voltage to the first gate structure 130, for example. For example, the internal or external gate voltage source may provide a first voltage (e.g. resulting in the first desired gate-emitter-voltage) to the first gate structure 130 to drive the insulated gate bipolar transistor structure in an on-state (e.g. state of maximal or nominal current) and a second voltage to the first gate structure 130 to drive the insulated gate bipolar transistor structure in an off-state.

The doping concentration and the conductivity type within the first nanowire structure 120 may influence the cut-off voltage to be applied to the first gate structure 130 to drive the insulated gate bipolar transistor structure from an on-state to an off-state or from the off-state to the on-state.

For example, the first nanowire structure 120 may comprise throughout the whole nanowire structure the same conductivity type as the drift region 112. In this case, the first nanowire structure 120 may be a self-conducting structure if the gate-emitter-voltage $V_{GE}$ is equal to 0, for example. For an n-channel IGBT structure, a negative gate-emitter-voltage may be applied for driving the insulated gate bipolar transistor structure into the off-state.

The first nanowire structure 120 may comprise a similar doping concentration as the drift region 112 or may comprise a significantly higher doping concentration. In other words, at least the drift region 112 of the insulated gate bipolar transistor structure may comprise a first conductivity type (e.g. n-doping for an n-channel IGBT) with a first average doping concentration (e.g. $1 \times 10^{12}$ to $1 \times 10^{15}$) and at least a part of the first nanowire structure 120 may comprise the first conductivity type with a second average doping concentration (e.g. $1 \times 10^{17}$ to $1 \times 10^{21}$). An average doping concentration may be a number of dopants per volume averaged over the region of interest. For example, the second average doping concentration may be larger than twice the first average doping concentration (or larger than 10 times or larger than 100 times). In this way, a current of minority charge carriers (e.g. holes for an n-channel IGBT) may be reduced due to the high doping concentration within at least a part of the first nanowire structure 120.

Optionally, an additional region comprising the second conductivity type (e.g. p-doping for an n-channel IGBT) may be formed within a part of the first nanowire structure 120 to be controlled by the first gate structure 130 (the part of the first nanowire structure, the first gate structure extends along). In other words, at least a part of the first nanowire structure 120 may comprise a second conductivity type with a third average doping concentration arranged between the drift region 112 and the part of the first nanowire structure 120 comprising the first conductivity type (e.g. shown in FIG. 2). In this way, the cut-off voltage or threshold voltage of the insulated gate bipolar transistor structure may be influenced so that the insulated gate bipolar transistor structure is in an off-state, if the gate-emitter-voltage is equal to 0, for example.

For example, the second average doping concentration is larger than twice (or larger than 10 times or larger than 100 times) the third average doping concentration (e.g. $10^{12}$ to $10^{14}$).

For example, the dopant distribution and/or the dimensioning of the first nanowire structure 120 may be selected so that a current strength of a current through the first nanowire structure 120 may be caused by charged carriers of a first charge carrier type (e.g. electrons for an n-channel IGBT structure) may be at least 10 times (or 100 times or 500 times or 1000 times) larger than a current through the first nanowire structure 120 caused by charge carriers of a second charge carrier type (e.g. holes for an n-channel IGBT structure) in an on-state of the insulated gate bipolar transistor structure. Such an electrical connection may be considered as unipolar, for example. In this way, the on-state resistance of the insulated gate bipolar transistor structure may be significantly reduced.

For accelerating the reduction of the charge carrier confinement or depleting the electron hole plasma within the drift region 112 during turn off, a second nanowire structure may be formed in connection with the drift region 112. The second nanowire structure 120 of the insulated gate bipolar transistor structure may comprise a size and/or may be formed according to the possibilities mentioned in connection with the first nanowire structure 120, for example.

Figure 2:
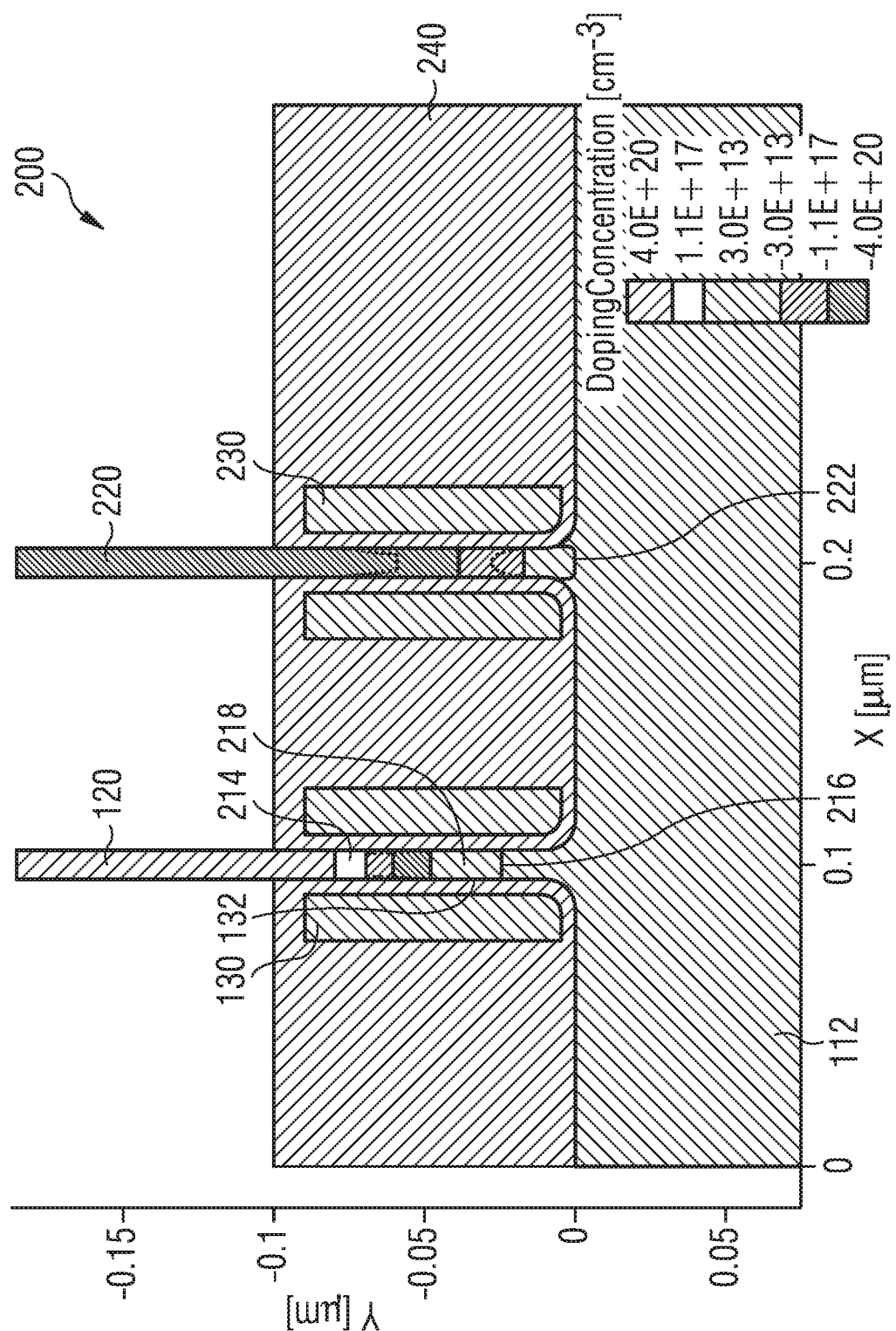
FIG. 2 shows another schematic cross section of an insulated gate bipolar transistor device.

Further, a second gate structure may be implemented extending along at least a part of the second nanowire structure (e.g. shown in FIG. 2). A current through the second nanowire structure may be controllable through a voltage applied to the second gate structure similar to the control of the current through the first nanowire structure 120 by the first gate structure 130, for example.

For example, at least a part of the second nanowire structure comprises the second conductivity type, if at least the drift region 112 of the insulated gate bipolar transistor structure comprises the first conductivity type. In this way, a pn-junction may be formed between the drift region 112 and the part of the second nanowire structure 130 comprising the second conductivity type. In this way, an unipolar current path for charge carriers of the opposite carrier type than the charge carrier flowing through the first nanowire structure (e.g. electrons through the first nanowire structure and holes through the second nanowire structure for an n-channel IGBT) may be provided.

The drift region 112 and at least a part of the first nanowire structure 120 may comprise the first conductivity type (e.g. n or p) and at least a part of the second nanowire structure may comprise the second conductivity type (e.g. p or n). The first conductivity type may indicate a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate a p-doping and the second conductivity type may indicate an n-doping or vice versa.

For example, substantially the whole current through the IGBT structure may flow through the one or more first nanowire structures 120 (e.g. more than 90%, more than 95% or more than 99%) in an on-state of the insulated gate bipolar transistor structure, while the one or more second nanowire structures may be kept in a non-conducting state by applying a suitable voltage to the one or more second gate structures 230. During switch-off the current flow through the one or more first nanowire structures 120 may be cut off through a suitable voltage applied to the one or more first gate structures 130, while a current of the opposite charge carrier type (e.g. holes for an n-channel IGBT) is enabled to flow through the one or more second nanowire structures by applying a suitable voltage to the second gate structures 230, for example. In this way, the reduction or depletion of the electron-hole-plasma within the drift region 112 during switch off may be accelerated. In this way, the softness and the energy loss of the switch-off of the IGBT structure may be improved. Therefore, the durability and/or life cycle of the device may be increased.

An embodiment of an insulated gate bipolar transistor device 200 comprising at least two nanowire structures is shown in FIG. 2. The implementation of the insulated gate bipolar transistor device 200 (nanowire IGBT) is similar to the implementation shown in FIG. 1, but comprises at least an additional second nanowire structure 220 and a second gate structure 230 as described above.

For example, the first gate structure 130 and the second gate structure 230 may be connected or connectable to at least one gate voltage source module (e.g. common internal or external source for both or separate internal or external sources for each) configured to provide a first gate voltage to the first gate structure 130 and a second gate voltage to the second gate structure 230. The first gate voltage and the second gate voltage may be the same. For example, the first gate structure 130 and the second gate structure 230 may be short-circuited. Alternatively, the first gate voltage and the second gate voltage may be selectable independent from each other. In this way, the channel through the second nanowire structure 220 may be controllable independent from the channel through the first nanowire structure 120.

For example, a distance between the first nanowire structure 120 and the second nanowire structure 220 may be between 30 nm and 50 μm (or between 50 nm and 1 μm). Optionally, a plurality of first nanowire structures and/or a plurality of second nanowire structures may together implement one or more insulated gate bipolar transistor structures. A number of nanowire structures and/or a number of second nanowire structures used for implementing one insulated gate bipolar transistor structure may be selected depending on a desired maximal current of the insulated gate bipolar transistor device, for example.

An insulated gate bipolar transistor structure may comprise one or more equal or different basic cells of nanowire structures. A basic cell of nanowire structures may comprise a specified number (e.g. 1, 2, 3, 4 or more) of first nanowire structures of specified shape, doping distribution, doping concentration and/or oxide thickness (between gate structures and nanowire structures) and a specified number (e.g. 1, 2, 3, 4 or more) of second nanowire structures of specified shape, doping distribution, doping concentration and/or oxide thickness (between gate structures and nanowire structures) with specified distances to each other. Different basic cells may comprise different numbers of first nanowire structures, different numbers of second nanowire structures, different distances between nanowire structures and/or nanowire structures of different shape, doping distribution, doping concentration and/or oxide thickness. An insulated gate bipolar transistor structure may comprise only equal basic cells of nanowire structures or may comprise different basic cells of nanowire structures. For example, an insulated gate bipolar transistor structure may comprise a first basic cell type within a first region of the semiconductor substrate (e.g. within a cell region of an insulated gate bipolar transistor device) and a different second basic cell type within a second region of the semiconductor substrate. For example, the first basic cell type may comprise a higher nanowire structure density (e.g. nanowire structures per area) than the second basic cell type. For example, such basic cells may be implemented by the field effect structure of the semiconductor device shown in FIG. 8.

For example, the first nanowire structure 120 and the second nanowire structure 220 may be short-circuited through an emitter metal structure (e.g. aluminum or copper). The emitter metal structure may be implemented by a part of a metal layer of the layer stack of the insulated gate bipolar transistor device, for example. The ends of the nanowire structures in contact with the emitter metal structure may be highly doped regions (e.g. above $10^{18}/cm^3$). In this way, an ohmic contact may be formed between the nanowire structures and the emitter metal structure. Alternatively, the end of the nanowire structures in contact with the emitter metal structure may be a lower doped region (e.g. below $10^{18}/cm^3$). In this way, a Schottky contact may be formed between the nanowire structures and the emitter metal structure. The Schottky contact may further reduce the current of minority charge carriers through the respective nanowire structure. To further improve the Schottky contacts, different metals favoring n- or p-type contacts can be used for the respective contact type (e.g. Al for p-type, Er for n-type).

In the example shown in FIG. 2, the drift region 112, the first nanowire structure 120 and the second nanowire structure 220 comprise average doping concentrations as mentioned above. The first nanowire structure 120 comprises a first part in contact with the drift region 112 comprising the same first conductivity type and substantially the same first average doping concentration (e.g. $1\times10^{12}$ to $1\times10^{14}$) as the drift region 112 extending from the drift region 112 to a second part of the first nanowire structure 120. The second part 218 of the first nanowire structure 120 comprises the second conductivity type so that a first pn-junction 216 is formed towards the first part of the first nanowire structure 120 and a second pn-junction 214 is formed towards a third part of the first nanowire structure 120 comprising the first conductivity type. The second part of the first nanowire structure 120 comprises a third doping concentration (e.g. $1\times10^{17}$ to $1\times10^{21}$) and the third part of the first nanowire structure 120 comprises a second doping concentration (e.g. $1\times10^{17}$ to $1\times10^{21}$). The second part of the first nanowire structure 120 is located within the region of the first nanowire structure 120, the first gate structure 130 extends along. The second nanowire structure 220 comprises the second conductivity type and forms a pn-junction 222 towards the drift region 112. The pn-junction 222 is located outside the region of the second nanowire structure 220 the second gate structure 230 extends along, for example. Alternatively, the pn-junction 222 can be located inside the wire (within the part of the nanowire, the gate structure extends along or above or below the part of the nanowire the gate structure extends along). The drift region 112 and the gate structures are insulated from other conductive structures by an insulation layer 240 (e.g. silicon oxide), for example.

The example shown in FIG. 2 may comprises one or more optional additional features corresponding to one or more aspects mentioned in connection with the proposed concept or one or more embodiments described above or below (e.g. FIG. 1).

FIG. 2 shows an example of a 2D-cut through the proposed nanowire structure, for example. The n-wire is on the left, the p-wire on the right. Both wires are surrounded by gate insulators and gates.

The proposed 3D structure (see FIG. 2, FIG. 3 and FIG. 4) may easily reach the silicon on-state limit and/or may have a reduced capacitance and improved latch-up robustness, for example. One aspect is the combination of two silicon nanowire array-MOSFETs with a bulk drift region. One of the nanowires arrays acts as a p-MOSFET while the other one acts as an n-MOSFET. Each nanowire array may substantially only accommodate the current for one carrier type, i.e. either electrons or holes. The length of the nanowires in simulation (e.g. FIGS. 3 and 4) is 100 nm, the diameter is 10 nm and surrounding oxide thickness is 5 nm. The distance of the nanowires is in the range of 150 nm, for example. In this example, the gate is in a polysilicon gate-all-around configuration and the polysilicon thickness is 50 nm. The basic cell size which comprises one n-wire and one p-wire could be for example 1 µm×1 µm.

The conduction for holes may be nearly completely suppressed in the on-state, so that a good or optimal plasma distribution may be achieved, for example. The $V_{CE}(sat)$ may drop from about 1.7 V for a reference trench IGBT to about 0.9 V in the nanowire IGBT with the similar or very same vertical structure (see FIG. 5), for example. The voltage drop in the wire may be below 1 mV, in the drift zone the voltage drop may be 0.2 V and the pn-junction may dominate with a voltage drop of 0.7 V.

For example, for a single gate configuration, during turn-off, the n-channel in the n-wire is turned off, while the p-channel in the p-wire is turned on at the same time. Therefore, the hole current through the p-wire enables the removal of the plasma and due to the good electrostatics, which is due to the thin gate dielectric, latch-up may be practically impossible, for example. In the nanowire IGBT, latch-up may depend on the wire potential which is controlled by the gate instead of depending on a pn-j unction. This potential may be very well controlled in such small nanowires because they may utilize the effect of volume inversion. Because of quantization effects, the potential minimum for electrons or holes, respectively, may move from the insulator interface to the center of the wire, thus minimizing detrimental surface effects on mobility, for example. Since the wire potential of the p-region in the n-wire may be so well fixed by the gate, even a hypothetic large hole current flowing in the n-wire cannot forward bias the junction, for example. Moreover, the volume inversion may ensure that the wires act as substantially purely unipolar devices depending on the applied gate voltage.

The concept of separate n- and p-wires may also work with larger diameters because of the unipolar emitter contacts at the wire tip, for example. If the nanowire diameter is very small, e.g. <20 nm, and the wire and contact resistances may increase. This can be compensated by adding additional n- and p-wires to the unit cell until the resistivity is as small as desired.

While the small oxide thickness would lead to a large capacitance in stripe geometry, the use of nanowires may reduce the total capacitance dramatically. This may ensure fast switching and low switching losses. In simulations, a $t_d(off)$ of <500 ns (switching time) may be achieved in 100 nm long wires with a diameter of 10 nm and a surrounding gate oxide of 5 nm thickness (e.g. for a 2D simulation, see FIG. 6). The plasma sweep-out time may be similar to those of other IGBTs because it may be dominated by the plasma front dynamics in the drift region which is not affected by using nanowires, for example. This may imply that the turn-off losses are comparable to the reference trench IGBT. In simulations, a trench IGBT may have turn-off losses of 22 mJ, a proposed nanowire IGBT may show losses of 25 mJ, for example. Accordingly, the $E_{off}/V_{ce}sat$-trade-off may be greatly improved.

A further improvement may be achieved by using separate gate drivers for the n- and p-wires. If the hole path may be opened a few 10 ns before the n-path is closed, the plasma starts to desaturate before the actual sweep-out of the plasma, for example. This may enable a further reduction of the switching losses and times.

Figure 3:
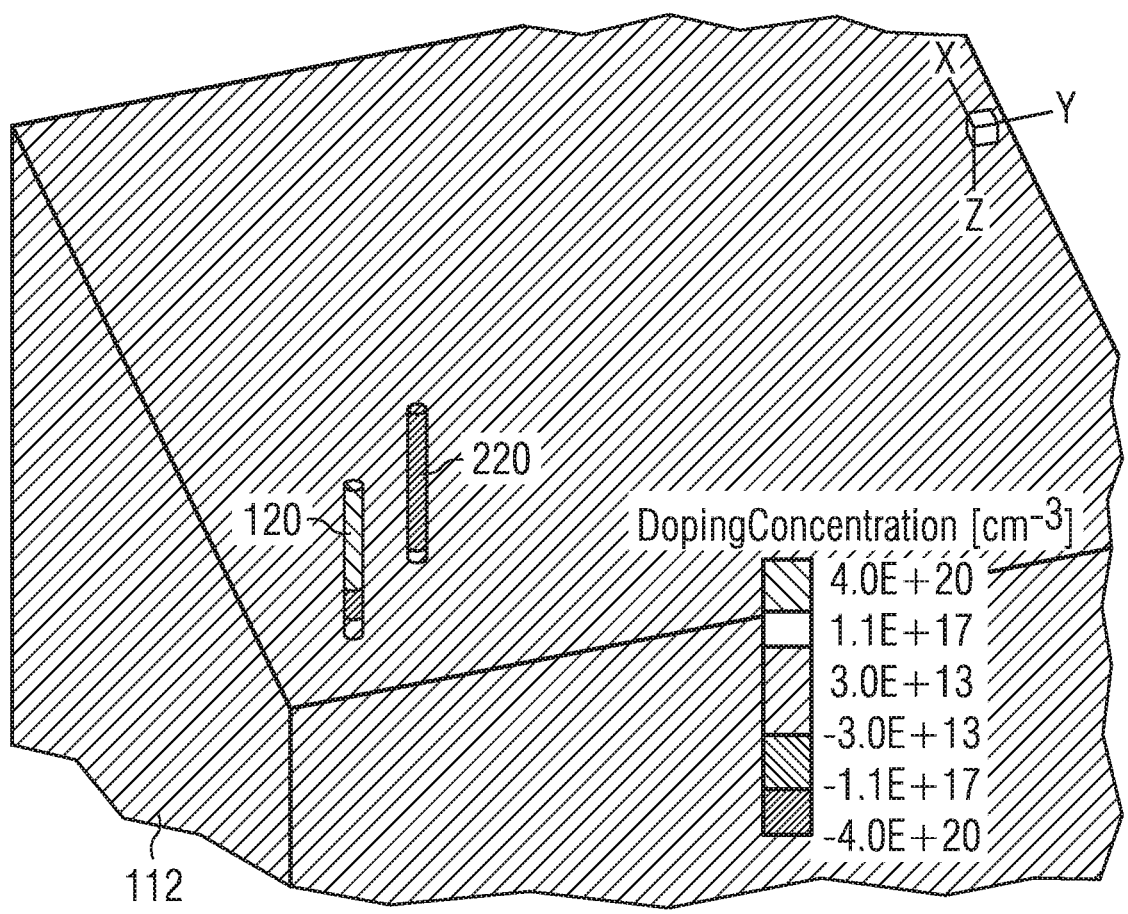
FIG. 3 shows a schematic three-dimensional illustration of two nanowire structures.

FIG. 3 shows an example of a 3D-overview of a possible basic cell (silicon only). The nanowires are arranged closely together.

FIG. 4 shows an example of a 3D-zoom on the nanowires in a gate-all-around arrangement.

Figure 5:
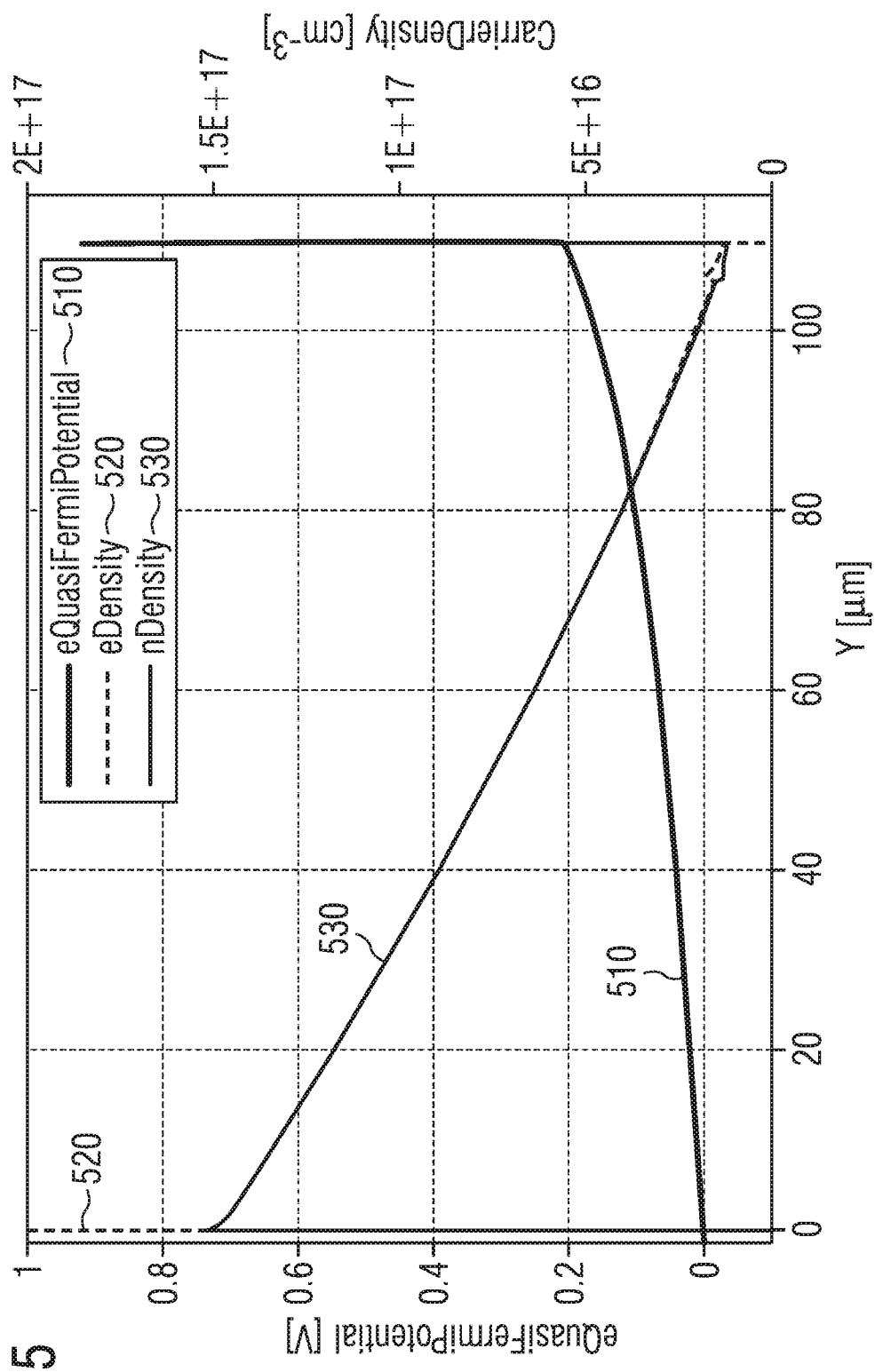
FIG. 5 shows a diagram indicating a voltage drop, an electron density and a hole density through a drift region of an insulated gate bipolar transistor device.

FIG. 5 shows an example of a potential distribution and plasma density in the on-state for a proposed nanowire IGBT. The electron density 520 and the hole density 530 decrease from the surface of the semiconductor substrate (interface between drift region and nanowire structures at 0 µm) and the p-emitter (at 110 µm). The shown equasiFermiPotential indicates the voltage drop over the drift region. The voltage drop is dominated by the pn-junction (between the drift region and the p-emitter).

FIG. 6 shows an example of the switching behavior of a 2D simulation of a strip-shaped transistor. Here, the large capacitance in 2D leads to a long $t_d(off)$. In 3D, the $t_d(off)$ is reduced to below 500 ns in 3D wire transistor, for example.

FIG. 7a shows a schematic top view (without insulator) and FIGS. 7b and 7c show two respective schematic cross sections (cut along gate finger and cut along n-wire) of an insulated gate bipolar transistor device according to an embodiment. The implementation of the insulated gate bipolar transistor device shown in FIGS. 7a through 7c is similar to the implementation shown in FIG. 2. However, the nanowire structures are arranged horizontally (substantially in parallel to the surface of the semiconductor substrate) instead of vertically.

The first nanowire structure 720 extends from a first via 710 connected to the drift region 112 to a first emitter structure 730 connected to an emitter metal 750. The part of the first nanowire structure 720 surrounded by the gate structure 740 extends substantially in parallel to the surface of the drift region 112. Further, the first nanowire structure 720 comprises a doping distribution in horizontal direction corresponding to the vertical doping distribution of the first nanowire structure shown in FIG. 2. The first emitter structure 730 may comprise or consist of highly n-doped silicon (e.g. above $10^{18}/cm^3$), for example.

The second nanowire structure 722 extends from a second via 712 connected to the drift region 112 to a second emitter structure 732 connected to an emitter metal 750. The part of the second nanowire structure 720 surrounded by the gate structure 740 extends substantially in parallel to the surface of the drift region 112. Further, the second nanowire structure 722 comprises a doping distribution in horizontal direction corresponding to the vertical doping distribution of the second nanowire structure mentioned in connection with the device shown in FIG. 2. The second emitter structure 732 may comprise or consist of highly p-doped silicon (e.g. above $10^{18}/cm^3$), for example.

The first nanowire structure 720 and the second nanowire structure 722 are surrounded or embedded by a common gate structure 740 between the vias to the drift region and the emitter structures. Alternatively, the first nanowire structure 720 and the second nanowire structure 722 may be surrounded or embedded by independent gate structures.

FIGS. 7a through 7c show a schematic view of a horizontal nanowire pair in single gate configuration, for example.

The example shown in FIGS. 7a through 7c may comprise one or more optional additional features corresponding to one or more aspects mentioned in connection with the proposed concept or one or more embodiments described above or below (e.g. FIG. 1 or 2).

Some embodiments relate to a dual nanowire-type IGBT with superior performance. The disclosed concept addresses several features which may be important for a next generation IGBT, namely a dramatic reduction of on-state losses, namely $V_{CE}(sat)$ reduction without increasing the dynamic losses ($E_{off}$) and/or greatly improved robustness against parasitic latch-up, for example.

IGBT structures use um-scale planar/trench cells or >100 nm wide trench mesa cells, for example. For example, such cells independent of their dimensions cannot achieve an optimal $V_{CE}(sat)$, because the electron-hole-plasma concentration at the trench bottom is limited by holes which escape through the mesa. Since a hole path may be provided in the top cell, the electron and hole-paths are kept closely together within the mesa and both exit the device via the common n-/p-top-emitter contact. However, the close neighborhood of the current paths may lead to potential latch-up.

For example, the silicon limit for the emitter-side plasma concentration in the IGBT may be reachable based on the proposed concept. If this limit could be reached, the $V_{CE}(sat)$ may be optimal. The limit of vanishing emitter hole current in the on-state may in principal be reached by using a stripe cell structure also. The stripe cell structure may have a relatively large oxide capacitance because of the thin oxide and the large channel width, in comparison to a device according to the proposed concept, for example.

For example it is proposed to use two small diameter nanowires MOSFETs (metal-oxide-semiconductor-field-effect-transistor) which feature unipolar transport even when turned off, to separate electron from hole currents. This may make it possible to block the hole current in the on-state which may lead to superior on-state losses and may provide a low resistive path for desaturating the drift-zone. Moreover, latch-up may be prevented by replacing the usual latch-up prone pn-junction by a gate-controlled potential barrier in the nanowires.

The embodiment presented in the simulations (e.g. FIGS. 3 and 4) uses a 1 µm×1 µm large basic cell size, where each cell comprises two nanowires, for example. However, if necessary for achieving large enough currents, additional n- and p-wires can be added. For a given chip size, the cell size may determine the number of wires per chip and thus the channel width. Therefore, the unit cell size may be adjusted according to the needs of the application. One of those nanowires may act as n-MOSFET, the other one as a p-MOSFET. This behavior may be achieved by implementing an n-type contact to one wire and a p-type contact to the other wire. The typical length of the wires may be between 50 nm and 1 µm, the diameter may be between 5 nm and 100 nm, where the volume inversion effect may set in below 30 nm in silicon. The distance between the two nanowires may be in the range between 50 nm and 1 µm. The crystal of the wire may have an epitaxic relationship to the bulk silicon which may represent the drift zone. For a 1200 V device, the drift zone may have a thickness of about 120 µm and a base doping of about $5e13/cm^3$. Both wires may be surrounded by a high quality gate insulator and a gate material. The gate insulator may have an effective electrical thickness between 0.5 nm and 20 nm. The two gates can either be connected together or contacted separately.

In the following and also already above, several fabrication methods and variations are elucidated for each part of the structure.

For example, the nanowires can either be arranged vertically or horizontally (e.g. see FIG. 1 or FIGS. 7a through 7c). In the vertical arrangement, they can be grown epitaxially in a bottom-up approach for example by the Vapor- Liquid-Solid technique. In order to achieve a regular wire arrangement, the wires may be grown using a 'templated growth'—technique, for example using porous alumina. Another approach is to create the wires by lithography and etching. The necessary small dimensions may be achieved by deep-UV lithography, nanoimprint lithography or direct beam lithography (for example e-beam). The etching may be highly anisotropic, for example a special RIE(ICP) (reactive ion etching inductively coupled plasma) process. After etching, the surfaces of the wires can be smoothed for example by using hydrogen annealing. Another option may be to start with a coarser lithography and use oxidation and etching to reduce the silicon diameter. In the top-down case, the shape of the n- and p-MOSFETs is not restricted to circular nanowires, for example. In addition, longer 'fin' type structures are also an option as long as the total capacitance does not increase too much, for example.

Doping of the two different wire types can be done for example by very low energy ion implantation or plasma-doping through a structured mask either before or after wire etching. Another option for bottom-up grown wires is in-situ doping during the growth. However, two consecutive growth processes may be necessary, where during the second growth process the first set of wires is protected against additional growth for example by an oxide layer.

In the horizontal arrangement of wires a top-down process may be performed, because the position of the wires can be controlled more easily. However, also a bottom-up process is possible. The starting substrate could be an SOI (silicon on insulator) with through BOX-vias (buried oxide) or a Silicon On Nothing substrate. The wires are structured by lithography and anisotropic etching. They may be arranged in a way that the 90° angle at the collector side of the wire sits on top of the drift zone, while the gated part of the wire may be isolated from the drift zone either by SOI or SON. In the horizontal embodiment, the emitter contact may be implemented as larger pads which may be connected to the wires and which may provide a good large area contact. Again, the emitter contact can be either doped as before or utilize Schottky-contacts, for example.

The on-state-wire (in an n-channel IGBT the n-wire and vice versa) can have a body doping to shift the threshold voltage to desired values, for example. This may be mainly possible in bottom-up wires or horizontal top-down wires. In vertical top-down wires, an angled implant or plasma doping with some kind of shielding for the contact region could be performed.

The n-type and p-type nanowires may comprise or may be made of different materials with optimal mobility for electrons and holes, respectively. For example the p-wire may comprise or may be made of SiGe or Ge or other materials with high hole mobility and the n-wire of InAs or a similar HEMT-material (high-electron-mobility transistor).

For example, the first nanowire structure and/or the second nanowire structure may comprise or consist of a semiconductor material (e.g. silicon-germanium SiGe, germanium Ge for the p-type nanowire structure and/or indium arsenide InAs) different from the semiconductor material of the semiconductor substrate (e.g. silicon).

The gate-insulator can be a thermally grown oxide or a conformal deposited high-k or low-k material, for example. This deposition could be done for example by LPCVD (low pressure chemical vapor deposition) or ALD (atomic layer deposition).

The gate can either be polysilicon or metals with appropriate work-functions, for example. In both configurations, the gate should be conformal deposited for example by LPCVD or metal-ALD (e.g. atomic vapor deposition, AVD). If necessary, the gate can be structured by lithography and etching after the deposition, for example. For example, if the two wires should be supplied with different gate voltages, a wiring scheme which can supply these voltages may be implemented by structured gates, for example.

FIG. 8 shows a schematic cross section of a semiconductor device 800 according to an embodiment. The semiconductor device 800 comprises a semiconductor substrate 810, a first nanowire structure 820 of a field effect structure connected to the semiconductor substrate 810 and a first gate structure 830 of the field effect structure extending along at least a part of the first nanowire structure 820. Further, the semiconductor device 800 comprises a second nanowire structure 840 of the field effect structure connected to the semiconductor substrate 810 and a second gate structure 850 of the field effect structure extending along at least a part of the second nanowire structure 840. At least a part of the semiconductor substrate 810 connected to the first nanowire structure 820 comprises a first conductivity type and at least a part of the first nanowire structure 820 comprises the first conductivity type. Further, at least a part of the semiconductor substrate 810 connected to the second nanowire structure 840 comprises a first conductivity type and at least a part of the second nanowire structure 840 comprises a second conductivity type.

Due to the implementation of nanowire structures with the corresponding gate structures, the semiconductor device can be controlled through substantially unipolar currents through the nanowires. Due to the substantially unipolar current flow through the nanowire structures, the on-state resistance of the semiconductor device may be significantly reduced. Further, the occurrence of an undesired latch-up may be significantly reduced. In this way the power loss may be reduced and/or the durability or life cycle of the semiconductor device may be increased.

A field effect structure may be a structure capable of controlling a current through the structure by a potential applied to a control electrode or gate electrode (e.g. a field effect transistor, an insulated gate bipolar transistor or a variable resistor).

More details and aspects are mentioned in connection with embodiments described above or below (e.g. regarding first nanowire structure, first gate structure, second nanowire structure, second gate structure, semiconductor substrate, conductivity type). The embodiment shown in FIG. 8 may comprises one or more optional additional features corresponding to one or more aspects mentioned in connection with the proposed concept or one or more embodiments described above or below (e.g. FIG. 1 or 2).

For example, the first nanowire structure 820 and the second nanowire structure 840 may be short-circuited through a metal structure. In other words, the ends of the first nanowire structure 820 and the second nanowire structure 840 opposite to the ends connected to the semiconductor substrate 810 may be connected to the same metal structure (e.g. emitter metal).

Some embodiments relate to a power semiconductor device. In other words, a semiconductor device according to the described concept or one or more embodiments described above may comprise a blocking voltage of more than 25 V (e.g. between 100 V and 10000 V or more than 500 V, more than 1000 V or more than 4000 V).

FIG. 9 shows a flow chart of a method 900 for forming an insulated gate bipolar transistor device according to an embodiment. The method comprises forming 910 a first nanowire structure of an insulated gate bipolar transistor structure connected to a drift region of a semiconductor substrate and forming 920 a first gate structure of the insulated gate bipolar transistor structure surrounding at least a part of the first nanowire structure.

Due to the implementation of a nanowire structure with the corresponding gate structure, the insulated gate bipolar transistor structure can be controlled by the gate structure controlling a substantially unipolar current through the nanowire. For example, for an n-channel insulated gate bipolar transistor structure substantially only electrons are able to pass the nanowire structure in an on-state of the insulated gate bipolar transistor structure. Due to the substantially unipolar current flow through the nanowire structure, the on-state resistance of the insulated gate bipolar transistor structure may be significantly reduced. Further, the occurrence of an undesired latch-up may be significantly reduced. In this way the power loss may be reduced and/or the durability or life cycle of the insulated gate bipolar transistor device may be increased.

More details and aspects are mentioned in connection with embodiments described above or below (e.g. regarding first nanowire structure, first gate structure, semiconductor substrate, drift region). The embodiment shown in FIG. 9 may comprises one or more optional additional acts corresponding to one or more aspects mentioned in connection with the proposed concept or one or more embodiments described above or below (e.g. FIGS. 1-8).

For example, the method may further comprise forming a second nanowire structure of the insulated gate bipolar transistor structure connected to the drift region and forming a second gate structure of the insulated gate bipolar transistor structure surrounding at least a part of the second nanowire structure.

Optionally, the method may further comprise implanting dopants of a first conductivity type into at least a part of a semiconductor material used for forming the first nanowire structure and implanting dopants of a second conductivity type into at least a part of a semiconductor material used for forming the second nanowire structure.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for XXX" may as well be understood as a "means configured to or suited for XXX". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device, comprising:
  a semiconductor substrate comprising a drift region of an insulated gate bipolar transistor structure, the drift region having a first conductivity type and being coupled to a collector electrode;
  at least one basic cell comprising:
  a first fin structure extending between the drift region and an emitter metal structure of the insulated gate bipolar transistor structure and comprising a region of the first conductivity type connected to the emitter metal structure;
  a first gate structure of the insulated gate bipolar transistor structure extending along at least a part of the first fin structure and configured to receive a first voltage from a gate voltage source module and to control an on-state and an off-state of the insulated gate bipolar transistor structure;
  wherein a current strength of a current through the first fin structure caused by charge carriers of a first charge carrier type is at least 10 times larger than a current through the first fin structure caused by charge carriers of the second charge carrier type in an on-state of the insulated gate bipolar transistor structure.

2. The semiconductor device of claim 1, wherein the region of the first conductivity type extends completely from the drift region to the emitter metal structure.

3. The semiconductor device of claim 2, wherein the insulated gate bipolar transistor structure is a normally-on device.

4. The semiconductor device of claim 1, wherein the first fin structure comprises a region of the second conductivity type arranged between the region of the first conductivity type and the drift region, and wherein the first gate structure is configured to control the flow of charge carriers of the first conductivity type in the region of the second conductivity type.

5. The semiconductor device of claim 1, wherein the insulated gate bipolar transistor structure is a normally-off device.

6. The semiconductor device of claim 1, wherein the at least one basic cell further comprises:
  a second fin structure extending between the drift region and the emitter metal structure and comprising a part of a second conductivity type connected to the emitter metal structure of the insulated gate bipolar transistor structure; and
  a second gate structure of the insulated gate bipolar transistor structure extending along at least a part of the second fin structure and configured to receive a second voltage from a gate voltage source module,
  wherein the second gate structure is configured to control a flow of charge carriers of the first conductivity type through the second gate structure.

7. The semiconductor device of claim 6, wherein the part of a second conductivity type of the second fin structure forms a p-n junction with the drift region, and wherein the p-n junction is disposed outside of a portion of the second fin that is immediately adjacent the second gate structure.

8. The semiconductor device of claim 6, wherein second fin structure further comprises a part of the first conductivity type between the part of the second conductivity type and the drift region, wherein the part of a second conductivity type forms a p-n junction with the part of a first conductivity type, and wherein the p-n junction is disposed within a portion of the second fin that is immediately adjacent the second gate structure.

9. The semiconductor device of claim 6, wherein the first gate structure and the second gate structure are each connected to the emitter metal by a wiring scheme that is configured to provide different gate voltages to the first and second gate structure.

10. The semiconductor device of claim 6, wherein the first fin structure is connected to the emitter metal structure by regions of the same conductivity type.

11. A semiconductor device, comprising:
  a semiconductor substrate comprising a drift region of an insulated gate bipolar transistor structure, the drift region having a first conductivity type and being coupled to a collector electrode;
  a first plurality of basic cells in a first region of the semiconductor substrate and a second plurality of the basic cells in a second region of the semiconductor substrate that is different from the first region, each of the basic cells comprising:
  a first fin structure extending between the drift region and an emitter metal structure of the insulated gate bipolar transistor structure and comprising a region of the first conductivity type connected to the emitter metal structure;
  a first gate structure of the insulated gate bipolar transistor structure extending along at least a part of the first fin structure and configured to receive a first voltage from a gate voltage source module and to control an on-state and an off-state of the insulated gate bipolar transistor structure;
  wherein the first gate structure is configured to control a flow of charge carriers of the first conductivity type through the first fin structure, and
  wherein a density of the first fin structures per area in the first plurality is greater than a density of the first fin structures per area in the second plurality.

12. The semiconductor device of claim 11 wherein for each of the basic cells, a current strength of a current through the first fin structure caused by charge carriers of a first charge carrier type is at least 10 times larger than a current through the first fin structure caused by charge carriers of the second charge carrier type in an on-state of the insulated gate bipolar transistor structure.

13. The semiconductor device of claim 11, wherein each of the basic cells further comprise:
  a second fin structure extending between the drift region and the emitter metal structure and comprising a part of a second conductivity type connected to the emitter metal structure of the insulated gate bipolar transistor structure; and
  a second gate structure of the insulated gate bipolar transistor structure extending along at least a part of the second fin structure and configured to receive a second voltage from a gate voltage source module,
  wherein the second gate structure is configured to control a flow of charge carriers of the first conductivity type through the second gate structure, and wherein a density of the second fin structures per area in the first plurality is greater than a density of the second fin structures per area in the second plurality.

* * * * *

UNITED STATES PATENT AND TRADEMARK OFFICE
CERTIFICATE OF CORRECTION

PATENT NO. : 10,748,995 B2
APPLICATION NO. : 16/506429
DATED : August 18, 2020
INVENTOR(S) : C. Sandow et al.

It is certified that error appears in the above-identified patent and that said Letters Patent is hereby corrected as shown below:

In the Claims

Column 18, Line 1 (Claim 8, Line 1), please change "wherein" to -- wherein the --.

Signed and Sealed this
Twenty-seventh Day of August, 2024

Katherine Kelly Vidal
*Director of the United States Patent and Trademark Office*